United States Patent [19]

Van de Grift et al.

[11] 4,371,868

[45] Feb. 1, 1983

[54] METHOD AND DEVICE FOR THE AUTOMATIC CALIBRATION OF AN ANALOG-TO-DIGITAL CONVERTER

[75] Inventors: Robert E. J. Van de Grift; Rudy J. Van de Plassche; Eise C. Dijkmans, all of Eindhoven, Netherlands

[73] Assignee: U.S. Philips Corporation, New York, N.Y.

[21] Appl. No.: 183,523

[22] Filed: Sep. 2, 1980

Related U.S. Application Data

[63] Continuation of Ser. No. 954,260, Oct. 24, 1978, abandoned.

[30] Foreign Application Priority Data

Aug. 11, 1977 [NL] Netherlands ........................ 7712273

[51] Int. Cl.[3] .............................................. H03K 13/20

[52] U.S. Cl. ...................... 340/347 CC; 340/347 AD; 324/130

[58] Field of Search .... 340/347 M, 347 AD, 347 CC, 340/347 NT; 324/99 D, 130

[56] References Cited

U.S. PATENT DOCUMENTS

| | | | |
|---|---|---|---|
| 3,316,547 | 4/1967 | Ammann | 340/347 AD |
| 3,500,196 | 3/1970 | Cooper | 340/347 CC |
| 3,633,202 | 1/1972 | Kuckein | 340/347 AD |
| 3,826,983 | 7/1974 | Garratt | 340/347 NT |
| 3,828,347 | 8/1974 | Sacks | 340/347 NT |
| 3,872,466 | 3/1975 | Wold | 340/347 CC |
| 3,942,173 | 3/1976 | Wold | 340/347 CC |
| 3,975,727 | 8/1976 | Mader | 340/347 CC |
| 3,987,435 | 10/1976 | Ikeda | 340/347 NT |

*Primary Examiner*—Charles D. Miller
*Attorney, Agent, or Firm*—James J. Cannon, Jr.

[57] ABSTRACT

For the automatic calibration of an analog-to-digital converter an analog calibration quantity is measured and the digital signal is compared with a digital calibration signal associated with the calibration quantity. A digital difference signal is applied to a register for influencing its counting capacity, while the register contents of pulses counted during the measurement also represents one of the parameters involved in the analog-to-digital conversion. Because of the fully digital character of the calibration, this calibration can be performed very rapidly and accurately.

3 Claims, 8 Drawing Figures

CONVERSION DEVICE
COUNTING REGISTER
STORAGE REGISTER
DISPLAY
DIGITAL COMPARATOR
CALIBRATION REGISTER
N

CONTROL SECTION
CONVERSION DEVICE
FF
N
DISPLAY
COUNTING REGISTER
DIGITAL COMPARATOR
CALIBRATION REGISTER

COUNTING REGISTER
FF
AFC
REGISTER
DISPLAY
DIGITAL COMPARATOR
CALIBRATION REGISTER

METHOD AND DEVICE FOR THE AUTOMATIC CALIBRATION OF AN ANALOG-TO-DIGITAL CONVERTER

This is a continuation, of application Ser. No. 954,260, filed Oct. 24, 1978 now abandoned.

BACKGROUND OF THE INVENTION

1. Field of the Invention

The invention relates to a method for the automatic calibration of an analog-to-digital converter, to which an analog input signal is applied and which produces a digital output signal, which via converter parameters as related to the input signal, a calibration signal being applied to the converter for calibration purposes and a digital signal obtained from said converter being compared with a digital calibration signal, so that a digital difference signal is obtained, which is used for the correction of a converter parameter to obtain the desired relationship.

2. Description of the Prior Art

Such a method is disclosed in German Patent Specification No. 1,282,685. In this specification it is proposed to convert a digital difference signal into an analog control quantity with the aid of a digital-to-analog converter, which quantity corrects a converter parameter in an analog manner. For this purpose the reference source is used, which supplies compensation charges or the timer which determines the time interval with which the output frequency is measured.

SUMMARY OF THE INVENTION

The invention is based on the recognition that the digital difference signal as such which is already available, can be used in a faster and more accurate manner, for influencing a digital register which is needed for the analog-to-digital conversion and which consequently constitutes a converter parameter.

The advantage of this is that calibration is fully digital, is faster and more accurate, generally requires less components, and can readily be included in an existing control cycle, which is for example controlled by a microprocessor.

For this purpose the method for the automatic calibration of an analog-to-digital converter is characterized in that the digital difference signal is added to the total counting capacity of a counting register, in which pulses are counted, the contents of this counting register constituting a converter parameter in known manner.

In accordance with the invention further elaborations of this method enable a plurality of calibration measurements to be performed consecutively, so as to increase the calibration accuracy. In this respect it has been found possible to employ the methods in such a way that after each calibration measurement the digital difference signal has further approximated zero and is added to the contents of the counting register or that after each calibration measurement the digital difference signal further approximates a final value and up from a fixed count is applied to the counting register as an offset.

As is to be explained in more detail, it is necessary in many cases to repeat the calibration measurement. The error in the indication can be reduced to zero by a single measurement under specific conditions only.

The invention also indicates how the method can be applied to known types of analog-to-digital converters.

Thus, a converter of the integrating type with two time intervals of the dual-slope type, is characterized in that in the calibration mode of the converter after a calibration measurement, the digital outputs of the counting register corresponding to the second time interval are connected to a digital comparator circuit, which is also connected to a register, which supplies the digital calibration signal, and the output of the comparator circuit supplies the digital difference signal to a buffer register which is connected to the counting register corresponding to the first time interval.

An analog-to-digital converter, which converts the analog quantity into a proportional frequency of a pulse train and in which the frequency is determined in a frequency meter, for which purpose there are provided a gate circuit, a timer comprising a counting register and a clock, and a pulse counter which supplies the digital output signal after counting the number of pulses from the analog frequency converter during the time interval defined by the timer, is characterized in that in the calibration mode of the converter after each calibration measurement, the digital difference signal is applied to a buffer register, which is connected to the counting register for adjusting the total counting capacity.

In an embodiment of this analog-to-digital converter there is provided a digital comparator circuit to which both the digital outputs of the pulse counter and the outputs of a calibration register, which supplies the digital calibration signal, are connected. The digital comparator circuit supplies the digital difference signal to the buffer register.

In a different embodiment in accordance with the invention the digital difference signal in the calibration mode is generated by the pulse counter itself and the pulse counter is preset by the digital calibration signal, or the measuring frequency pulse train and a calibration frequency pulse train are applied to the pulse counter via add and subtract inputs.

In yet another embodiment of the analog-to-digital converter in accordance with the invention, the analog frequency converter generating a pulse train which is synchronized with a clock frequency, the characteristic feature is that during a calibration measurement a digital filter circuit is included between the output of the analog frequency converter and the input of the pulse counter, and a calibration pulse train is associated with the applied calibration signal, which pulse train consists of identical pulse patterns, comprising a specific number of pulses for a specific and greater number of clock pulses, and furthermore the digital filter circuit suppresses the pulses of identical patterns and only supplies pulses in the presence of a deviating pattern.

In this type of analog-to-digital converter the pulse spacing between two pulses of the pulse train does not vary continuously as a function of the analog input quantity, but varies by distances which correspond to the clock pulse time. Thus, for the specific values of the input quantity this pulse train may consist of the same recurrent groups of pulses. A slight change in value of the input quantity will result in a pulse shift by one clock pulse period within one group, subsequently in a second group etc. until the entire pulse train consists of these new groups of patterns. A simple digital filter is now capable of suppressing a selected pattern and of transmitting only pulses of deviating groups. Thus the digital difference signal in accordance with the invention can be obtained.

In general the variation of the conversion parameters can be expressed in the measuring result by the factor 1+d, where d represents the error in the indication, and is to be minimized by the calibration. Consequently, the digital difference signal, as defined by the subject of the invention, contains the factor d. It is evident that if after calibration the measuring result in addition to the variation factor 1+d now exhibits the calibration factor 1/1+d, the measuring instrument has been calibrated ideally. This possibility occurs when a conversion parameter to be corrected is contained in the denominator and is to be adapted to the correct value by means of the difference signal with only one calibration measurement. This parameter then changes from the value P to the value P(1+d). Thus, a difference signal P·d is added. If the parameter to be corrected is contained in the numerator of the measuring result, it will generally be necessary to repeat the calibration several times in order to obtain an approximation of the function 1/1+d. The parameter then changes from the value P to the value P [1+summation f(d)], where f(d) each time represents the resulting difference signal. For example, in a special case the last mentioned expression may assume the value $P(1-d\ d^2-d^3+\ldots)$. This value is exactly equal to 1/1+d, when it is expanded into a series. When in this case one calibration measurement is performed, the measuring result contains (1+d) $(1-d)=1-d^2$. The error has consequently become $d^2$. For a sufficiently small d, $d^2$ may already smaller than the measuring accuracy, so that one measurement also suffices.

BRIEF DESCRIPTION OF THE DRAWINGS

The invention will now be described in greater detail with reference to the drawings. In the drawings.

DESCRIPTION OF THE PREFERRED EMBODIMENTS

Figure 1:
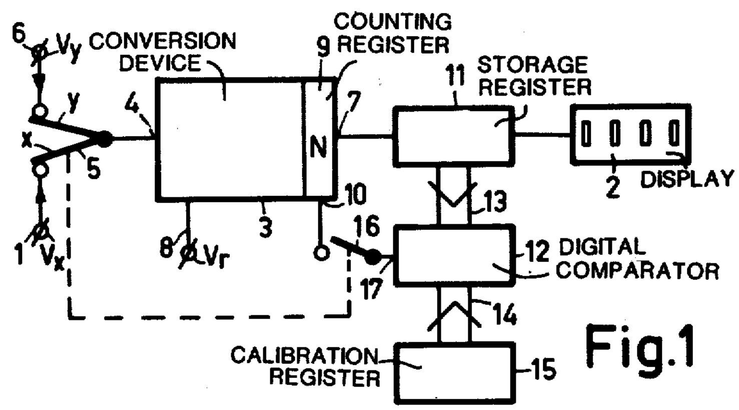
FIG. 1 shows a block diagram of an analog-to-digital converter with an automatic calibration facility in accordance with the invention.

FIG. 1 shows an analog-to-digital converter which converts an unknown measuring quantity $V_x$ applied to an input 1 into a digital signal, which is numerically displayed with the aid of a display panel 2. The conversion device 3 has an input 4 which in the measuring mode x can be connected to the input 1 by means of a switch 5 and in the calibration mode y to an input 6, to which input a calibration quantity $V_y$ is applied. At the output 7 a digital output signal is available which is related to the analog quantity applied to input 4. The said relationship depends on the converter parameter of the conversion device 3. One parameter is designated $V_r$ and is for example a reference quantity corresponding to the quantities $V_y$ and $V_x$, a second parameter is designated N in block 9, which represents a counting register, in which the pulses are counted during the measurements and whose contents of counted pulses is a converter parameter. The counting register has an input 10 for changing the total counting capacity. The digital output signal at output 7 is applied to a storage register 11, to which the panel 2 is connected and to a digital comparator circuit 12 via a multiple connection. Via a similar connection 14 a digital calibration signal from the calibration register 15 is applied to the comparator circuit 12. In the calibration mode of the analog-to-digital converter, i.e. when input 4 is connected to calibration input 6 via y, a switch 16 is closed, so that an output 17 of the comparator circuit 12 is connected to input 10 of the counting register 9 in order to supply a digital difference signal. The calibration signal stored in register 15 corresponds to the desired conversion of the value $V_y$ on input 6. For the operation of the analog-to-digital converter the following is assumed: the digital measuring signal in register 11 is D11, the calibration signal in register 15 is $D_y$, the combined converter parameters of the conversion device 3 are represented by $P_3$ with a variation from (1+d) to $P_3(1+d)$, furthermore there is converter parameter f(N), which is associated with register 9, the digital difference signal is $D_{17}$ and the relationship between the input quantities $V_x$ and $V_y$ and D11 is:

$$D11=P_3-f(N)\cdot V_x \tag{1}$$

and, $$D_y=P_3\cdot f(N)\cdot V_y \tag{2}$$

however, $$D_{11}=P_3(1+d)\cdot f(N)\cdot V_y \tag{3}$$

so that $$D_{17}=D_{11}-D_y=P_3-f(N)\cdot V_y\cdot d \tag{4}$$

If $f(N)=1/N_o$, where $N_o$ represents a count in register 9, corresponding to a number of counted pulses, and if the digital difference signal is added to the register 9 with a constant C, a new count is obtained in the register 9 after one calibration measurement, which is $$N_1=N_o+C\cdot P_3\cdot 1/N_o\cdot V_y\cdot d \tag{5}$$

If now $$N_o=C\cdot P_3\cdot 1/N_o\cdot V_y=C\cdot D_y \tag{6}$$

then $$N_1=N_o(1+d) \tag{7}$$

and in accordance with (3)

$$D11=P_3\cdot(1+d)\cdot 1/N_o(1+d)\cdot V_y=D_y \tag{8}$$

so that the error is reduced to zero with one calibration measurement, while requirement (6) can simply be met by selection of the factors.

Figure 2:
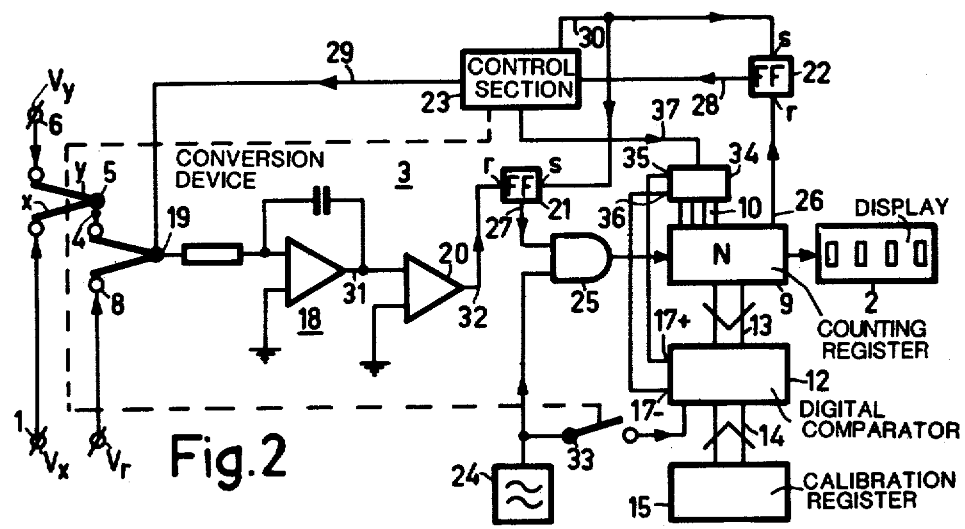
FIG. 2 shows an integrating analog-to-digital converter with a calibration facility in accordance with the invention, FIG. 3 also shows an analog frequency converter.

FIG. 2 shows the circuit diagram of an integrating voltmeter, which features the automatic calibration method in accordance with the invention. The conversion device 3 in known manner comprises the integrator 18 with switch 19 for switching from input 4 for the voltage to be measured to the input 8 for the reference voltage $V_r$, the comparator 20, the flip-flops 21 and 22 and control section 23, a clock pulse generator 24 and a gate 25. This type is comprehensively described in U.S. Pat. No. 3,316,547. Register 9 is first used for counting down the first fixed time interval in which the voltage to be measured is integrated and subsequently for measuring the second time interval in which the reference voltage is integrated in the reverse direction. The register 9 is a shift register which receives clock pulses from the generator 24 via the gate 25, so that the time intervals may be expressed by the formula $T=M/f_c$ in which M is a number of counted pulses in the register 9 and $f_c$ the clock frequency. As the integrator 18 always starts and stops at a zero reference level, which is determined by reset means, not shown, and by the action of the comparator 20, the forward integration is equal to the back-integration or:

$$V_{xm}\cdot N\cdot 1/f_c=V_r n\cdot 1/f_c \quad (9)$$

where $V_{xm}$ is the average value of the measuring voltage during the first integration interval, N is a fixed number of counting pulses in register 9, and n is a number of measuring pulses therein. It is assumed that before calibration of the analog-to-digital converter register 9 has a counting capacity of $N_o$ pulses reckoned from a initial count, which may be zero but which may also have a certain positive or negative value. In FIG. 2 this is indicated by the lines 10. The final count is given by output 26, which is connected to the reset input r of flip-flop 22.

The automatic calibration method is as follows. A calibration voltage $V_y$ is applied to input 6 and the measuring instrument is set to the calibration mode, so that input 4 receives the calibration voltate. In accordance with equation (9):

$$V_y N_o=V_r n_y \quad (10)$$

where $n_y$ represents the digital output signal, which corresponds to a number of counting pulses in register 9 and to the digital calibration signal stored in register 15. The first calibration measurement is as follows. Register 9 and integrator 18 are in the initial position. The control section 23 receives a start command, upon which switch 19 is switched to input 4 and integration of $V_y$ in integrator 18 starts. Simultaneously, flip-flop 21 is set to the 1-state via input 5, and so is flip-flop 22. The signal on output 27 of flip-flop 21 opens gate 25, so that clock pulses are applied to counting register 9. When this register reaches the count $n_o$, a signal appears on output 26, upon which flip-flop 22 is reset and reports this to the control section 23 via connection 28. By means of the signals on the connections 29 and 30 the integration of $V_y$ and the counting of clock pulses is terminated. Flip-flop 21 is in the 0-state, register 9 is again in an initial position and control section 23 switches switch 19 to input 8, sets flip-flop 21 to the 1-state, and the back-integration with reference voltage $V_r$ is performed, while simultaneously clock pulses are counted in register 9. When the output voltage on output 31 passes through the zero level, comparator 20 supplies a reset signal for flip-flop 21 to output 32, so that gate 25 is closed and counting of clock pulses in register 9 is discontinued. The count $n_1$ is now compared with the calibration signal $n_y$ of register 15 in the digital comparator 12. If it is assumed that there is an error d, then:

$$(1+d)\cdot V_y N_o=V_r n_1 \quad (11)$$

Comparator 12 will supply a digital difference signal:

$$_1n_{17}=n_1-n_y=n_y d \quad (12)$$

in accordance with equations (10) and (11). By subsequently closing a switch 33 this difference signal $n_{17}$ can be transferred to a buffer register 34 with the aid of clock pulses, which register may be a reversible counter with a forward counting input 35 and a reverse counting input 36. A control signal from control section 23 on connection 37 transfers the contents of the buffer register 34 to register 9 via the input lines 10, so that the initial count of the register is changed before each subsequent measurement. Assuming that there is a transfer factor c, the counting capacity of register 9 has become $$N_1=N_0-c\cdot n_y d \quad (13)$$

With (10), (11), (12), (13) a second measurement gives as a result:

$$n_2=n_y(1+d)\,(1-c\cdot n_y\cdot d/N_0) \quad (14)$$

and $$_2n_{17}=n_y\cdot d\left[1-\frac{cn_y}{N_0}(1+d)\right]=n_y\cdot d\cdot B \quad (15)$$

When p calibration measurements are performed, it can be calculated that the counting capacity N and the digital difference signal $N_{17}$ satisfy $$N_p=\frac{N_0}{1+d}(1+d\cdot B^p) \quad (16)$$

and $$_pn_{17}=n_y d\cdot B^{p-1} \quad (17)$$

For this purpose each signal $n_{17}$ which is obtained should be added to the instantaneous contents of the buffer register 34. Depending on the sign of $n_{17}$ this may also be a subtraction. From equation (16) and (17) it is evident that the error d is corrected when after p measurements the factor with B has become sufficiently small. For this the absolute value of B should be smaller than 1. This yields the requirement:

$$c\, n_1<2N_o \quad (18)$$

If $$c\, n_y=N_0 \quad (19)$$

$-d$ is obtained for B and the series expansion mentioned in the introduction is obtained.

Figure 3:
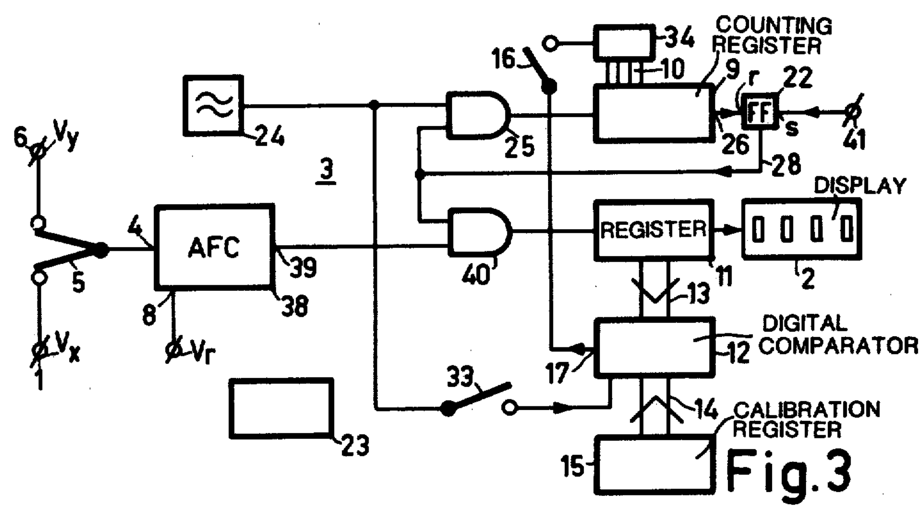

The analog-to-digital converter of FIG. 3 corresponds to the device mentioned in the introduction. However, the section which relates to automatic calibration is largely identical to the section described with reference to FIG. 2. The analog frequency converter 38 may be a voltage-controlled oscillator or may be of the type in which charge compensation or charge balancing is employed, which means that in the form of a pulse standard charges are applied to an integrator or are extracted from an integrator, yielding a balanced condition in respect of the value of the input quantity. Examples of this can be found in U.S. Pat. Nos. 2,885,662 and 3,051,939.

In FIG. 3 the pulse frequency is measured in register 11 in that gate 40 is open during a measuring interval. The measuring interval is determined by means of the clock pulse generator 24, the gate 25, the register 9, and the flip-flop 22. When it is assumed that the pulse frequency at output 39 is f, the measuring time T, the clock frequency $f_c$ and the counting capacity of register 9 is N, then f=const. $V_x$ and $T=N/f_c$, so that the contents of register 11 and thus the digital output signal will be:

$$n_{11}=N/f_c\text{const.}\,V_x \tag{20}$$

Equations (12) through (17), as well as the calibration method that has been described, are then also valid.

It is alternatively possible to simplify the calibration device of FIG. 2 and FIG. 3 by employing the register 11 as digital comparator circuit. Block 12 is then dispensed with, via a gate circuit register 15 is directly connected to register 11 via the connection 30-14, and furthermore the line with switch 33 and the output 17 are connected to register 11. The control section 23 ensures that for determining the digital difference signal the contents of register 15 is transferred to register 11 in FIG. 3 and to register 9 of FIG. 2 as an offset for these registers. Subsequently, the pulses are admitted, which correspond to or are related to the input signal of the analog-to-digital converter. By subtraction a digital difference signal is obtained, which with clock pulses via switch 33 can be transferred from the register 11 to buffer register 34 via switch 16 in accordance with FIG. 3 and from the register 9 to buffer register 34 of FIG. 2 via the outputs 17+ and 17−.

Figure 4:
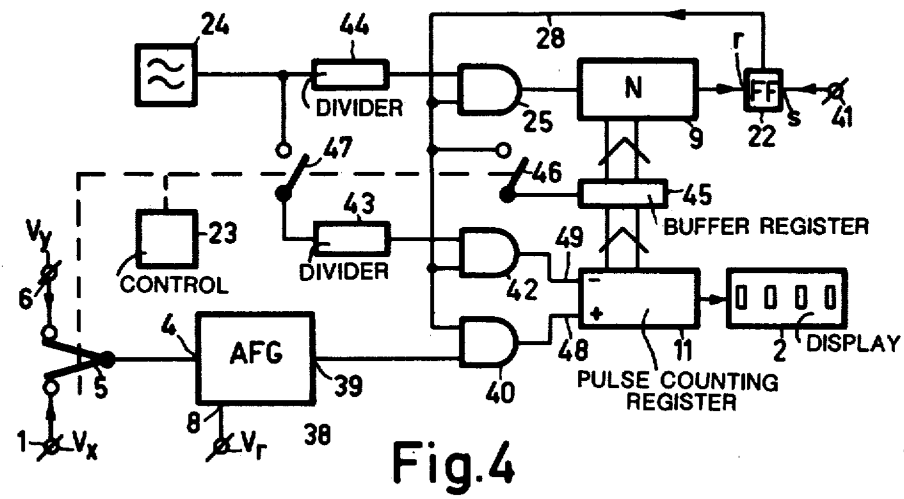
FIG. 4 shows a different embodiment with a clock pulse generator as calibration signal source.

FIG. 4 shows a variant of the calibration method which requires no calibration register, which is replaced by a calibration source which supplies a calibration frequency.

Preferably, the same clock pulse generator needed for the time measurement, which can simply be stabilized at an accurate frequency, is employed as calibration source. The operation of the device of FIG. 4 largely corresponds to that of FIG. 3. The method of FIG. 4 also employs an analog frequency converter 38, whose frequency is measured with a clock pulse oscillator 24, a gate 25, a register 9 and a flip-flop 22 with a start input 41, and a gate 40 and pulse counting register 11. In this case the register 11 is also employed for generating the digital difference signal and there is provided a buffer register 45 for taking over this signal and in order to obtain an offset for register 9. When the control section 23 has actuated the switches 5, 46 and 47 in the calibration mode of the converter, calibration measurements can be performed, the calibration method being different from the previously described method. In FIG. 4 the register 11 is a reversible counter with an add input 48 to which the measuring frequency pulses are applied via gate 40, and with a subtract input 49 to which calibration pulses are applied via gate 42, which calibration pulses are derived from the clock pulse generator 24 via a divider 43. The measuring interval is again determined by the chain which includes clock pulse generator 24, a divider 44, the gate 25 and register 9 with counting capacity N, controlled by flip-flop 22, which is set to the 1-state by a start signal on input s and 41. In this state the gates 25, 42 and 40 are opened by a signal on line 28. This signal disappears as soon as counter 9 is full and supplies a reset signal to input r of flip-flop 22. The buffer register 45 which takes over the digital difference signal upon termination of the calibration measurement for the offset of register 9, is connected to register 11. Since during the measuring interval a signal is stored in register 11 which is proportional to the difference between the applied pulse frequencies, a balanced condition should be pursued, for which the digital difference signal stored in register 11, with a factor of buffer register 45, is equal to the amount by which register 9 is corrected in order to produce the same digital difference signal in register 11 in the measuring time interval thus obtained. It is evident that the register 9 should be adjusted each time starting from a fixed count, and that the digital difference signal, which does not become zero with this method, should always be added to register 9 up from said count (with a factor c). When it is again assumed that:

$$f=\mathit{const.}\ V_x \text{ and measuring interval } T=N\cdot g\cdot 1/f_c$$

where g is the dividing factor of the divider 44 and N the counting capacity of register 9, and furthermore the calibration frequency $f_y=l\cdot f_c$ where l is the dividing factor of divider 43 and $f_c$ the clock frequency, then:

$$r=(f-f_y)\cdot N\cdot g\cdot 1/f_c \tag{21}$$

where r is the number of pulses stored in register 11 as digital difference signal after the calibration measurement.

After the first measurement $$r_1=l\cdot g\cdot N_0\cdot d \tag{22}$$

and $$N_1=N_0-c\cdot l\cdot N_0\cdot d \tag{23}$$

The second calibration measurement yields:

$$N_2=N_o-c\cdot r_2=N_0[1-clgd+(clgd)^2] \tag{24}$$

If the absolute value of clgd is smaller than one, the following value is obtained after a plurality of measurements:

$$N=N_0/1+clgd \tag{25}$$

When subsequently the voltage $V_x$ is measured, $D_{11}$ representing the number of pulses counted in register 11, then:

$$D_{11}=l\cdot f_c\cdot V_x/V_y(1+d/1+clgd\cdot g)1/f_c\cdot N_0 \tag{26}$$

The error is then eliminated, if $$c\cdot l\cdot g\cdot=1 \tag{27}$$

so that $$D_{11}=l\cdot g\cdot N_0\cdot V_x/V_y \tag{28}$$

It is obvious to select the factors t, l and g to equal 1, so that a simple transfer of digital information into and from the register is effected without division of multiplication factors. However, it may be preferable to take half the clock frequency for the calibration frequency, for example because the analog frequency converter 38 is synchronized with the same clock frequency. Then $l=\frac{1}{2}$ and when g=1, c should equal 2.

Figure 5:
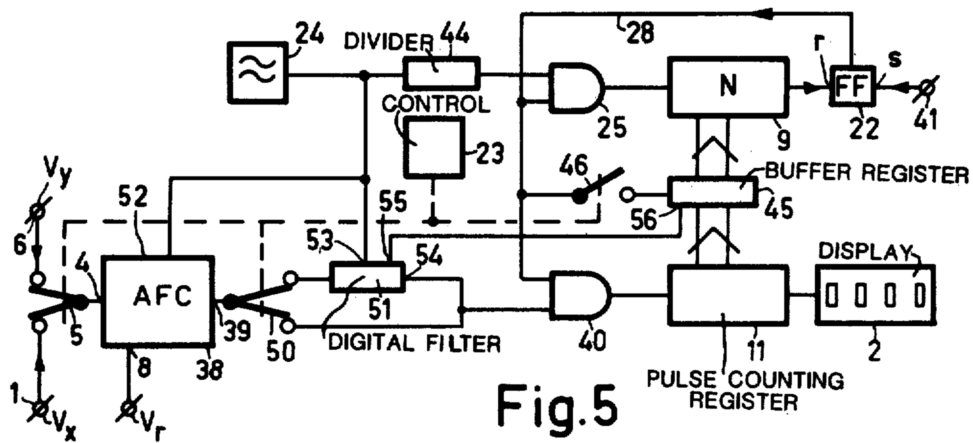
FIG. 5 shows an embodiment with a digital filter circuit.

The circuit diagram of FIG. 5 largely corresponds to that of FIG. 4. However, for calibration no use is made of a calibration frequency source, but a digital filter circuit 51 is employed, while the analog frequency converter 38 is provided with an input 52 for synchronization of the output pulse frequency with the clock frequency. For the same purpose, the filter circuit 51 is provided with an input 53. The control section 23 ensures that with the aid of a switch 50 the filter circuit 51 is included in the connection between output 39 and gate 40 in the calibration mode.

An analog frequency converter which satisfies the above description, is described in "Philips Electronic Applications", vol. 29, no. 4, 1969, pages 117–128 under the title "inexpensive digital voltmeter" by D. J. G. Janssen. Reference is made in particular to FIGS. 1, 2 and 3.

Figure 6:
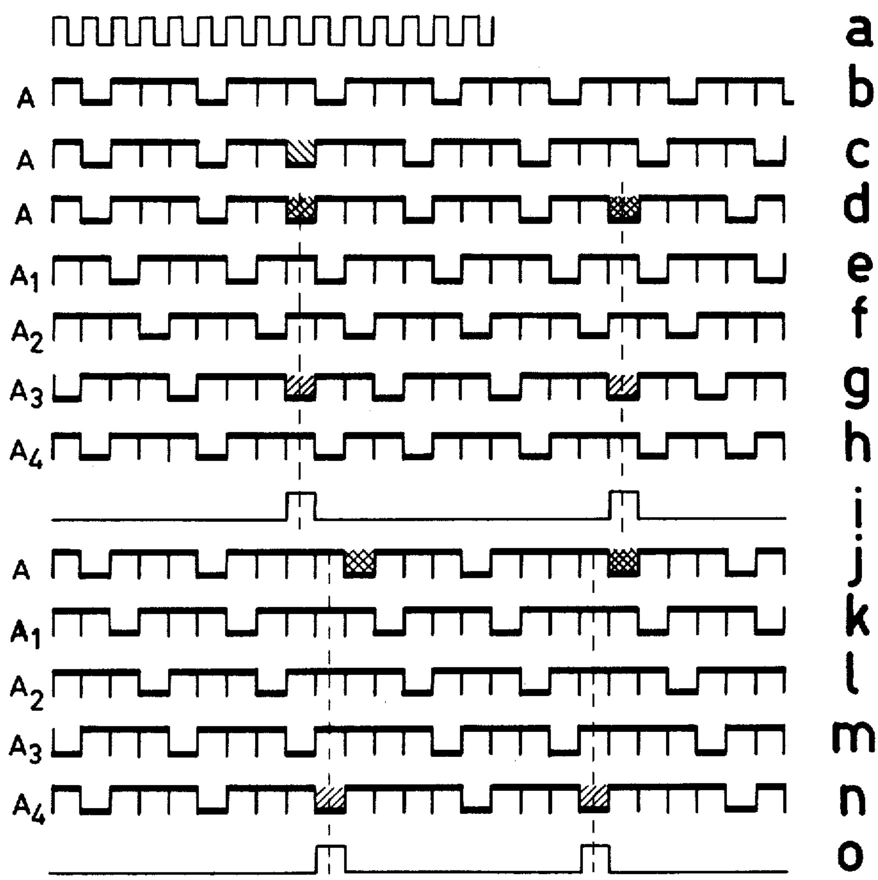
FIG. 6 shows a number of pulse train diagrams associated with the device of FIG. 5, FIGS. 7 and 8 show digital filter circuits to be used in the device of FIG. 5.

To explain the operation of the device of FIG. 5, FIG. 6 shows a number of diagrams which all have the same horizontal time axis.

FIG. 6*a* shows a part of the clock pulse train from clock pulse generator 24.

FIG. 6*b* represents the measuring pulse train as supplied to output 39 of the analog frequency converter 38 for a specific input voltage on input 4. Comparing FIG. 6*a* with FIG. 6*b* reveals that the measuring pulse train is controlled by the clock frequency. FIG. 6*b* shows that a regularly recurring pulse pattern exists, consisting of 3 positive pulses and one negative pulse or, put differently, 3 pulses of level 1 and one pulse of level 0.

When for example the measuring voltage ranges from 0 to $V_{max}$, pulse level 0 may correspond to 0 volts, and the pulses of level 1 indicate that the voltage is within range. These pulses are then counted in counter 11 during the measuring interval. The frequency f of the pulse train can be expressed by a number M1 of pulses of level 1 divided by the measuring interval T, or $$f = \frac{M_1}{M_1 + M_0} f_c \tag{29}$$

when $M_0$ represents the number of pulses of level 0 and $f_c$ is the clock frequency. If the regular pattern now consists of $m_1$ pulses of level 1, and one pulse of level 0 then:

$$f = \frac{m_1}{m_1 + 1} f_c \tag{30}$$

The pattern may alternatively comprise one pulse of level 1 and m pulses of level 0, so that $$f = \frac{1}{m_0 + 1} f_c \tag{31}$$

If the voltage ranges from $-V_{max}$ to $+V_{max}$, the counter 11 is a reversible counter and the connection from output 39 to counter 11 via gate 40 is a double connection, of which one connection supplies the said positive pulses to the add input of the counter and the other connections supplies the said negative pulses of the subtract input.

If the total number of positive pulses is $M_p$, the total number of negative pulses is $M_n$, the number of positive pulses is $m_p$ in a pattern with one negative pulse or the number of negative pulses is $m_n$ in a pattern with one positive pulse, then:

$$f = \frac{M_p - M_n}{M_p + M_n} f_c \tag{32}$$

and in the case of regular patterns and a positive input voltage:

$$f = \frac{m_p - 1}{m_p + 1} f_c \tag{33}$$

or for a negative input voltage:

$$f = \frac{m_n - 1}{m_n + 1} f_c \tag{34}$$

FIG. 6*c* shows a pulse train, which contains one deviating pattern, namely a pattern with 2 positive pulses and 1 negative pulse. The output frequency of the analog frequency converter has consequently slightly decreased.

FIG. 6*d* shows 2 of such deviating patterns, which indicates towards a further decrease of the output frequency. FIG. 6*j* shows 2 deviating patterns in the case of a frequency increase, namely 4 positive against 1 negative pulse per deviating pattern. It will be evident that upon a further variation of the frequency, the pattern m against 1 is gradually replaced by the next pattern, i.e. m+1 against 1 or m−1 against 1.

The purpose of the digital filter circuit 51 is to prevent the patterns selected for calibration from being transferred to the counter 11. Only pulses which correspond to a deviating pattern are counted. For the pulse train of FIG. 6*d* this means that three consecutive positive pulses plus 1 negative pulse are suppressed and that for example the indicated negative pulses, to which only 2 consecutive positive pulses belong, are transferred. This is shown in FIG. 6*i*. Similarly, the shaded negative pulses of FIG. 6*j* can produce counting pulses in the digital filter circuit by the combination with 4 consecutive positive pulses, as indicated in FIG. 6*o*.

When formulas (32) and (33) are applied in conjunction with the previously described pulse train of FIG. 6 in the circuit of FIG. 5 and furthermore the deviation from the calibration pulse train, as represented by formula 33, is again expressed by the factor 1+d, it can be demonstrated that the frequency of the counting pulses in the counter 11 during calibration satisfies:

$$f_d \tfrac{1}{2} \cdot (m-1) \cdot d \cdot f_c \tag{35}$$

The calibration method as described with the aid of the formulas (21) through (27) may also be applied in this case, which eventually results in the requirement:

$$c \cdot g \cdot \tfrac{1}{2} \cdot (m-1) = 1 \tag{36}$$

Applied to the example of FIGS. 5 and 6, where $m_p$=m=3, it is also obvious to select c=g=1. For other values of m, i.e. a different calibration voltage and a different frequency of the corresponding calibration pulse train, c and g will deviate from 1, g being a fraction and c being an integral multiplicand.

The calibration method applied to the formulas in accordance with (29) and (30) yields the following requirement:

$$c \cdot g \cdot m \cdot = 1 \quad (37)$$

In that case m=4 may for example be taken, i.e. $f_y=0.8f_c$ and c=1, so that $g=\frac{1}{4}$.

Figure 7:
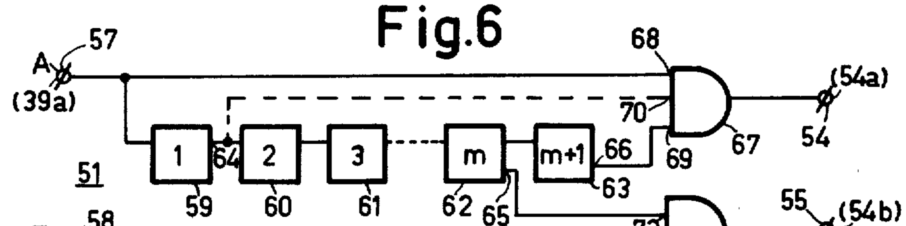

An example of a simple digital filter circuit is shown in FIG. 7. The input of this filter is represented by the terminal 57 and the terminal 58, which in FIG. 5 can be interconnected to the output 39 via the switch 50, which supplies positive pulses to terminal 57, designated A both in FIG. 6 and FIG. 7 and negative pulses to terminal 58, designated $\bar{A}$. The blocks 59 through 63 represent delay stages, which shift a pulse at their inputs by one clock period in time. This is indicated by the pulse train A1 in FIG. 6*e*, which becomes available on output 64 of block 59. Similarly, the pulse train A2 of FIG. 6*f*, A3 of FIG. 6*j*, and A4 of FIG. 6*h*, and the pulse trains A1 through A4 of FIGS. 6*k*, *l*, *m* and *n*, respectively which are available on the outputs of the blocks 60, 61, 62 and 63 respectively.

In FIG. 7 the number 3 should be inserted for m when the pulse trains of FIG. 6 are to be generated, so that in the present example block 61 may be dispensed with. Block 62 then produces a HIGH level on an inverting output 65, when a negative pulse is contained in the pulse train A3. This is indicated by $\bar{A}3$. Similarly, block 63 produces a HIGH signal on an inverting output 66, corresponding to $\bar{A}4$. Comparing FIG. 6*d* through 6*h* and 6*j* through n with each other, reveals that in the case of a deviating pulse pattern A coincides with $\bar{A}4$ or $\bar{A}$ with A4. Therefore, the AND-gate 67 is connected to input 57 by an input 68 for the pulses A and input 69 is connected to output 66 for the pulses $\bar{A}4$. Thus, output 54 will always supply a pulse if the requirement: $A.\bar{A}4=1$, in Boolean algebra notation is satisfied. In counter 11 this pulse can be counted so as to form the digital difference signal. However, it is necessary to know whether the difference signal is positive or negative. For this purpose AND-gate 71 is included, which supplies a pulse to output 55 when its input 72, which is interconnected to the input 58 for $\bar{A}$, and its input 73, interconnected to output 75 for A3, are HIGH. The deviating pattern in accordance with FIG. 6*j* satisfies the corresponding Boolean expression: $\bar{A}.\bar{A}3=1$. The output 55 is interconnected to an input 56 of buffer register 45 for storing the polarity sign. The operation is as follows: the calibration voltage $V_y$ produces a pulse train whose frequency is for example too low. The error d consequently has a negative sign. FIG. 6*d* is valid. During the measuring interval pulses from output 54 are counted in counter 11. After the measurement the contents of the counter 11 is taken over by the buffer register 45, because switch 46 is then closed and the signal on line 28 has disappeared. Since there has also been a signal on output 56 the contents of buffer register 46 is transferred to register 9 with a negative sign, in conformity with the negative sign of the error d, see for example formula (23). In this case the digital difference signal is consequently not subtracted from the counting capacity N of register 9, but is added to it, so that the total counting capacity increases, the measurement is prolonged and the measuring result is increased so as to compensate for the frequency being too low.

If in this example the measured calibration frequency is too high, the diagrams of FIGS. 6*j* through 6*n* apply, output 54 supplies the counting pulses and output 55 supplies no signal and the contents of the buffer register 45 is subtracted from the counting capacity N, as is indicated by formula (23). Finally the error d is now also positive owing to the frequency being too high.

When the counter 11 is a reversible counter the connection between the output 55 and the input 56 is not necessary. In FIG. 7 a third input 70 of AND-gate 67 is then connected to the output of block 59 for the information A1. In the calibration mode of the analog-to-digital converter input 57 is connected to output 39*a*, which supplies the information A, while input 58 is connected to output 39*b* for the information $\bar{A}$. The output of AND-gate 67 is now designated (54*a*) and is connected to the add input of the counter 11 via gate 40. Owing to the additional input 70 the gate satisfies the expression $A.A1.\bar{A}4=1$, which is in conformity with FIGS. 6*j*, 6*k* and 6*n*. The pulses of FIG. 60 are consequently supplied by output 54*a*. The output, which is designated (54*b*) in FIG. 7, is connected to the subtract input of counter 11, to which consequently the pulses of FIG. 6*i* are supplied.

Figure 8:
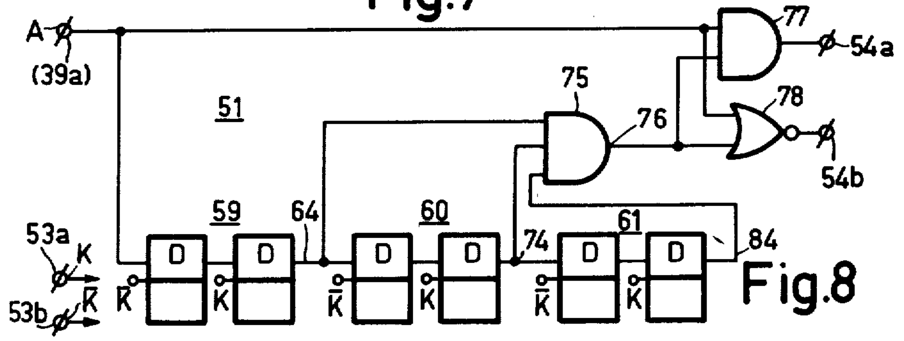

FIG. 8 shows how the blocks of FIG. 7 can be realized with D-flip-flops which are controlled by clock pulses derived from generator 24 and applied to input 53, as indicated in FIG. 8 by an input 53*a* for the clock pulses $\bar{K}$ and by an input 53*b* for the clock pulses K, which ensure that the levels on the flip-flop inputs are transferred to the outputs. Thus, the pulse train A1 in accordance with FIG. 6*e* or FIG. 6*k* is available on output 64, the pulse train A2 in accordance with FIG. 6*f* or FIG. 6*l* on output 74, and the pulse train A3 of FIG. 6*g* or FIG. 6*m* on output 84. These trains are applied to the AND-gate 75 whose output 76 is connected to the AND-gate 77, to which the pulse train A is also applied, so that the output 54*a* supplies a pulse only if: A.A1.A2-.A3.=1 is satisfied. This is also evident from FIGS. 6*j*, 6*k*, 6*l* and 6*o*. The output 76 is also connected to a NOR-gate 78, to which also the pulse train A is applied, so that the pulses in accordance with FIG. 6*i* are available on output 54*b*.

The circuit in accordance with FIG. 8 is not more intricate than that of FIG. 7 but has the advantage that output pulses are always supplied in the case of a deviation from the pattern against 1, for example because owing to a disturbance not the pattern m+1 or m−1, but m+2 or m−2 is produced, while moreover only m delay stages are included.

For the formation of the digital filter circuit it is also possible to employ other digital elements, using Boolean algebra. The circuits described with reference to FIG. 7 and FIG. 8 are only given by way of example.

What is claimed is:

1. An analog-to-digital converter with automatic calibration having an analog frequency converter, a gate circuit, a timer comprising a counting register, a clock, and a pulse counter which supplies the digital output signal after counting the number of pulses from said analog frequency converter during the time interval defined by said timer, characterized in that:

in the calibration mode a digital filter circuit is connected between the output of the frequency converter and the input of the pulse counter of said converter after each calibration measurement the digital difference signal is applied to a buffer register, which is connected to the counting register for adjusting the total counting capacity.

2. An analog-to-digital converter as claimed in claim 1, wherein the digital difference signal is available on the digital outputs of the pulse counter.

3. An analog-to-digital converter as claimed in claim 2, the analog frequency converter producing a pulse train which is synchronized with a clock frequency, characterized in that:

a calibration pulse train is associated with the applied calibration signal, which pulse train consists of identical pulse patterns comprising a specific number of pulses for a specific and greater number of clock pulses; and furthermore the digital filter circuit suppresses the pulses of identical patterns and only supplies pulses in the presence of a deviating pattern.

* * * * *